(12) United States Patent
Xu

(10) Patent No.: US 10,203,530 B1
(45) Date of Patent: Feb. 12, 2019

(54) PIXEL DRIVING CIRCUIT AND LCD PANEL

(71) Applicant: SHENZHEN CHINA STAR OPTOELECTRONICS SEMICONDUCTOR DISPLAY TECHNOLOGY CO., LTD, Shenzhen, Guangdong (CN)

(72) Inventor: Hongyuan Xu, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/739,997

(22) PCT Filed: Nov. 28, 2017

(86) PCT No.: PCT/CN2017/113336
§ 371 (c)(1),
(2) Date: Dec. 27, 2017

(51) Int. Cl.
*G09G 3/30* (2006.01)
*G06F 3/038* (2013.01)
*G02F 1/133* (2006.01)
*G02F 1/1343* (2006.01)
*G09G 3/36* (2006.01)
*G02F 1/1362* (2006.01)
*H01L 27/12* (2006.01)

(52) U.S. Cl.
CPC ........ *G02F 1/13306* (2013.01); *G02F 1/1343* (2013.01); *G02F 1/136286* (2013.01); *G09G 3/3607* (2013.01); *H01L 27/124* (2013.01); *G02F 2201/121* (2013.01)

(58) Field of Classification Search
CPC .. G09G 3/3233; G09G 3/3266; G09G 3/3291; G09G 2300/0819; G09G 2300/0842; G09G 2300/0852; G09G 2300/0861; G09G 2310/0243; G09G 2310/08; G09G 2320/0233; G09G 2320/0238; G09G 2330/028
See application file for complete search history.

(56) References Cited

U.S. PATENT DOCUMENTS

2013/0120332 A1* 5/2013 Tanaka ................. G09G 3/3648
345/207
2014/0049711 A1* 2/2014 Sakai .................... G02F 1/1345
349/33

* cited by examiner

*Primary Examiner* — Nelson Rosario
(74) *Attorney, Agent, or Firm* — Soroker Agmon Nordman

(57) ABSTRACT

The present disclosure provides a pixel driving circuit and a liquid crystal display (LCD) panel. A first terminal, a second terminal, and a third terminal of the second switch are connected with a data line, a common electrode line, a second pixel electrode, respectively. The first terminal, the second terminal, and the third terminal of the second switch are turned on, and a voltage of the second pixel electrode is between a data voltage provided by the data line and a common voltage provided by the common electrode line, such that a predetermined voltage difference is formed between the first pixel electrode and the second pixel electrode.

20 Claims, 3 Drawing Sheets

PIXEL DRIVING CIRCUIT AND LCD PANEL

BACKGROUND OF INVENTION

1. Field of Invention

The present disclosure relates to the field of liquid crystal displays, and more particularly to a pixel driving circuit and a liquid crystal display (LCD) panel.

2. Description of Prior Art

A liquid crystal display (LCD) panel usually includes a color filter substrate, a thin film transistor (TFT) substrate, and a liquid crystal layer arranged between the color filter substrate and the TFT substrate, where a pixel electrode and a common electrode are both arranged on opposite inner sides of the color filter substrate and the TFT substrate. Voltage changes controls orientation of liquid crystal molecules, and light of a backlight module reflect to generate images. Vertical alignment (VA)-type LCD panels have more advantages, such as high contrast, wide viewing angles, alignment without friction, and are widely used. However, the VA-type LCD panels use liquid crystals rotating vertically, the difference of birefringence of the liquid crystal molecules is greater, such that color shifting is more serious from a wide viewing angle.

In order to improve the color shifting of VA-type LCD panels, capacity-coupling technology, charge sharing technology, common electrode voltage modulation technology, and 3T technology are used. Currently, 3T technology is the most advantageous in low-color shift circuits. In 3T technology, the liquid crystal molecules in different regions of a same sub-pixel unit have different rotational angles through three TFTs to improve the color shifting. However, the 3T technology needs many TFTs, such that the aperture ratio is large and parasitic capacitance increases, further affecting display of the LCD panel.

Therefore, it is necessary to provide a pixel driving circuit and an LCD panel to solve the above issue of the prior art.

SUMMARY OF INVENTION

The aim of the present disclosure is to provide a pixel driving circuit and a liquid crystal display (LCD) panel capable of solving the color shift problem, such that the aperture ratio increases and parasitic capacitance is not increased, further improving the display.

In order to achieve the above aim, the present disclosure provides a pixel driving circuit, where the pixel driving circuit comprises:

a plurality of sub-pixel units defined by a plurality of scanning lines intersecting with a plurality of data lines. Each of the sub-pixel units is connected with one scanning line and one data line. Each of the sub-pixel units comprises a first switch, a second switch, a first pixel electrode, and a second pixel electrode.

The first switch has a control terminal, a first terminal, and a second terminal. The control terminal of the first switch is connected with one of the scanning lines, the first terminal of the first switch is connected with one of the data lines, and the second terminal of the first switch is connected with the first pixel electrode. The first terminal and the second terminal of the first switch are turned on under control of a scanning signal provided by the scanning line.

The second switch has a control terminal, a first terminal, a second terminal, and a third terminal. The control terminal of the second switch is connected with one of the scanning lines, the first terminal of the second switch is connected with one of the data lines, the second terminal of the second switch is connected with a common electrode line, and the third terminal of the second switch is connected with the second pixel electrode. The first terminal, the second terminal, and the third terminal of the second switch are turned on under control of the scanning signal provided by the scanning line such that a predetermined voltage difference is formed between the first pixel electrode and the second pixel electrode.

In the pixel driving circuit of the present disclosure, the first switch is a thin film transistor (TFT), the control terminal, the first terminal, and the second terminal of the first switch are a gate electrode, a source electrode, and a drain electrode of the TFT, respectively.

The second switch is a double-source electrode TFT. The control terminal, the first terminal, the second terminal, and the third terminal of the second switch are a gate electrode, a first source electrode, a second source electrode, and a drain electrode of the double-source electrode TFT, respectively.

The first pixel electrode and the second pixel electrode both correspond to four domains of liquid crystal molecules.

In the pixel driving circuit of the present disclosure, the first source electrode, the second source electrode, and the drain electrode of the double-source electrode TFT are on a same layer, and the drain electrode of the double-source electrode TFT is arranged between the first source electrode and the second source electrode of the double-source electrode TFT.

In the pixel driving circuit of the present disclosure, a voltage of the first pixel electrode is a data voltage provided by one of the data lines. A relationship between a voltage of the second pixel electrode and the voltage of the first pixel electrode is V2=(V1*L2−Vcom*L1)/(L1+L2), where V2 is the voltage of the second pixel electrode, V1 is the voltage of the first pixel electrode, Vcom is a common voltage provided by the common electrode line, L1 is a distance between the first source electrode and the drain electrode of the double-source electrode TFT, and L2 is a distance between the second source electrode and the drain electrode of the double-source electrode TFT.

In the pixel driving circuit of the present disclosure, the scanning line, the gate electrode of the TFT, and the gate electrode of the double-source electrode TFT are formed from a same metal layer.

In the pixel driving circuit of the present disclosure, the gate electrode of the TFT and the gate electrode of the double-source electrode TFT share a same electrode.

In the pixel driving circuit of the present disclosure, the data line, the source electrode and the drain electrode of the TFT, the first source electrode, the second source electrode and the drain electrode of the double-source electrode TFT are formed from a same metal layer.

In the pixel driving circuit of the present disclosure, the source electrode of the TFT and the first source electrode of the double-source electrode TFT share a same electrode.

The present disclosure provides a pixel driving circuit, where the pixel driving circuit comprises: a plurality of sub-pixel units defined by a plurality of scanning lines intersecting with a plurality of data lines. Each of the sub-pixel units is connected with one scanning line and one data line. Each of the sub-pixel units comprises a first switch, a second switch, a first pixel electrode, and a second pixel electrode.

The first switch has a control terminal, a first terminal, and a second terminal. The control terminal of the first switch is connected with one of the scanning lines, the first terminal of the first switch is connected with one of the data lines, and the second terminal of the first switch is connected with the first pixel electrode. The first terminal and the second terminal of the first switch are turned on under control of a scanning signal provided by the scanning line.

The second switch has a control terminal, a first terminal, a second terminal, and a third terminal. The control terminal of the second switch is connected with one of the scanning lines, the first terminal of the second switch is connected with one of the data lines, the second terminal of the second switch is connected with a common electrode line, and the third terminal of the second switch is connected with the second pixel electrode. The first terminal, the second terminal, and the third terminal of the second switch are turned on under control of the scanning signal provided by the scanning line such that a predetermined voltage difference is formed between the first pixel electrode and the second pixel electrode.

In the pixel driving circuit of the present disclosure, the first switch is a thin film transistor (TFT), the control terminal, the first terminal, and the second terminal of the first switch are a gate electrode, a source electrode, and a drain electrode of the TFT, respectively.

The second switch is a double-source electrode TFT. The control terminal, the first terminal, the second terminal, and the third terminal of the second switch are a gate electrode, a first source electrode, a second source electrode, and a drain electrode of the double-source electrode TFT, respectively.

In the pixel driving circuit of the present disclosure, the first source electrode, the second source electrode, and the drain electrode of the double-source electrode TFT are on a same layer, and the drain electrode of the double-source electrode TFT is arranged between the first source electrode and the second source electrode of the double-source electrode TFT.

In the pixel driving circuit of the present disclosure, a voltage of the first pixel electrode is a data voltage provided by one of the data lines. A relationship between a voltage of the second pixel electrode and the voltage of the first pixel electrode is $V2=(V1*L2-Vcom*L1)/(L1+L2)$, where $V2$ is the voltage of the second pixel electrode, $V1$ is the voltage of the first pixel electrode, $Vcom$ is a common voltage provided by the common electrode line, $L1$ is a distance between the first source electrode and the drain electrode of the double-source electrode TFT, and $L2$ is a distance between the second source electrode and the drain electrode of the double-source electrode TFT.

In the pixel driving circuit of the present disclosure, the scanning line, the gate electrode of the TFT, and the gate electrode of the double-source electrode TFT are formed from a same metal layer.

In the pixel driving circuit of the present disclosure, the gate electrode of the TFT and the gate electrode of the double-source electrode TFT share a same electrode.

In the pixel driving circuit of the present disclosure, the data line, the source electrode and the drain electrode of the TFT, the first source electrode, the second source electrode and the drain electrode of the double-source electrode TFT are formed from a same metal layer.

In the pixel driving circuit of the present disclosure, the source electrode of the TFT and the first source electrode of the double-source electrode TFT share a same electrode.

In the pixel driving circuit of the present disclosure, the first pixel electrode and the second pixel electrode both correspond to four domains of liquid crystal molecules.

In order to achieve the above aim, the present disclosure further provides the LCD panel, where the LCD panel comprises the pixel driving circuit. The pixel driving circuit comprises a plurality of sub-pixel units defined by a plurality of scanning lines intersecting with a plurality of data lines. Each of the sub-pixel units is connected with one scanning line and one data line. Each of the sub-pixel units comprises a first switch, a second switch, a first pixel electrode, and a second pixel electrode.

The first switch has a control terminal, a first terminal, and a second terminal. The control terminal of the first switch is connected with one of the scanning lines, the first terminal of the first switch is connected with one of the data lines, and the second terminal of the first switch is connected with the first pixel electrode. The first terminal and the second terminal of the first switch are turned on under control of a scanning signal provided by the scanning line.

The second switch has a control terminal, a first terminal, a second terminal, and a third terminal. The control terminal of the second switch is connected with one of the scanning lines, the first terminal of the second switch is connected with one of the data lines, the second terminal of the second switch is connected with a common electrode line, and the third terminal of the second switch is connected with the second pixel electrode. The first terminal, the second terminal, and the third terminal of the second switch are turned on under control of the scanning signal provided by the scanning line such that a predetermined voltage difference is formed between the first pixel electrode and the second pixel electrode.

In the pixel driving circuit of the present disclosure, the first switch is a thin film transistor (TFT), the control terminal, the first terminal, and the second terminal of the first switch are a gate electrode, a source electrode, and a drain electrode of the TFT, respectively.

The second switch is a double-source electrode TFT. The control terminal, the first terminal, the second terminal, and the third terminal of the second switch are a gate electrode, a first source electrode, a second source electrode, and a drain electrode of the double-source electrode TFT, respectively.

In the pixel driving circuit of the present disclosure, the first source electrode, the second source electrode, and the drain electrode of the double-source electrode TFT are on a same layer, and the drain electrode of the double-source electrode TFT is arranged between the first source electrode and the second source electrode of the double-source electrode TFT.

In the pixel driving circuit of the present disclosure, a voltage of the first pixel electrode is a data voltage provided by one of the data lines. A relationship between a voltage of the second pixel electrode and the voltage of the first pixel electrode is $V2=(V1*L2-Vcom*L1)/(L1+L2)$, where $V2$ is the voltage of the second pixel electrode, $V1$ is the voltage of the first pixel electrode, $Vcom$ is a common voltage provided by the common electrode line, $L1$ is a distance between the first source electrode and the drain electrode of the double-source electrode TFT, and $L2$ is a distance between the second source electrode and the drain electrode of the double-source electrode TFT.

The present disclosure provides the pixel driving circuit and the LCD panel to connect the first terminal, a second terminal, a third terminal of the second switch with the data line, the common electrode line, the second pixel electrode, respectively, such that voltage of the second pixel electrode is between the data voltage provided by the data line and the common voltage provided by the common electrode line. Furthermore, a predetermined voltage difference is formed between the first pixel electrode and the second pixel electrode. Thus, the color shift problem is solved, the aperture ratio increases, and parasitic capacitance is not increased, further improving the display.

BRIEF DESCRIPTION OF DRAWINGS

In order to more clearly illustrate the above content of the present disclosure, a description is made of the drawings which are needed for carrying out the embodiments. The following will briefly introduce the drawings for the embodiment. Obviously, the following description is only a few embodiments, for the common technical personnel in the field it is easy to acquire some other drawings without creative work.

DETAILED DESCRIPTION OF PREFERRED EMBODIMENTS

The present disclosure will further be described in detail in accordance with the figures of the embodiment of the present disclosure. In order to describe clearly the embodiment in the present disclosure or the prior art, the following will briefly introduce the drawings for the embodiment. Obviously, the following description is only a few embodiments, for the common technical personnel in the field it is easy to acquire some other drawings without creative work.

Figure 1:
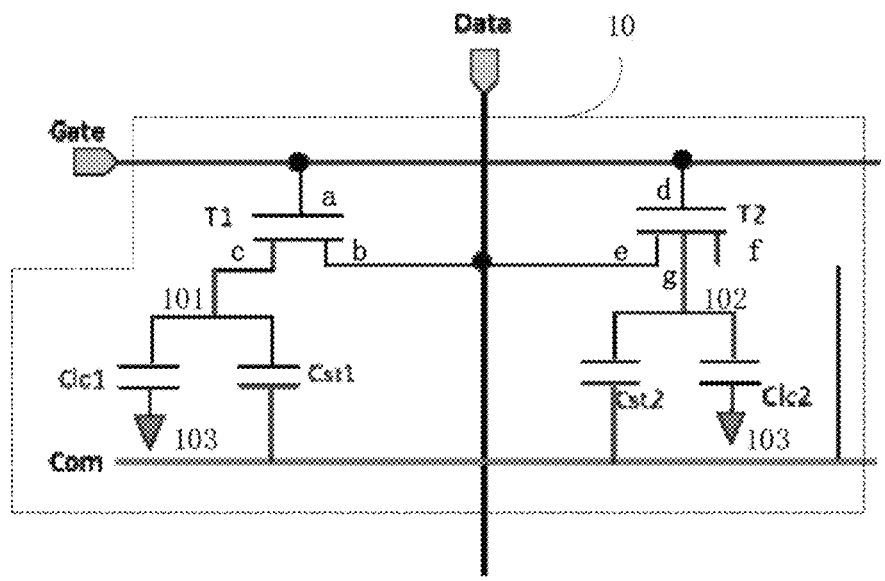
FIG. 1 is a schematic diagram of a pixel driving circuit of a preferred embodiment of the present disclosure.

FIG. 1 is a schematic diagram of a pixel driving circuit of a preferred embodiment of the present disclosure. The pixel driving circuit comprises a plurality of sub-pixel units defined by a plurality of scanning lines intersecting with a plurality of data lines; each of the sub-pixel units is connected with one scanning line and one data line. The embodiment of the present disclosure only shows one scanning line (Gate), one data line (Data), and one sub-pixel unit 10.

Each of the sub-pixel units 10 comprises a first switch T1, a second switch T2, a first pixel electrode 101, and a second pixel electrode 102. The first switch T1 has a control terminal a, a first terminal b, and a second terminal c. The control terminal a of the first switch T1 is connected with the scanning line Gate, the first terminal b of the first switch is connected with the data line Data, and the second terminal c of the first switch is connected with the first pixel electrode 101. The first terminal b and the second terminal c of the first switch are turned on under control of a scanning signal provided by the scanning line Gate, and data voltage provided by the data line is output to the first pixel electrode 101.

The second switch T2 has a control terminal d, a first terminal e, a second terminal f, and a third terminal g, where the control terminal d of the second switch T2 is connected with one of the scanning lines, the first terminal e of the second switch T2 is connected with one of the data lines, the second terminal f of the second switch T2 is connected with a common electrode line, and the third terminal g of the second switch T2 is connected with the second pixel electrode. The first terminal e, the second terminal f, and the third terminal g of the second switch 12 are turned on under control of the scanning signal provided by the scanning line such that a data voltage provided by the data line Data and a common voltage provided by the common electrode line Com, and a predetermined voltage difference is formed between the first pixel electrode and the second pixel electrode.

Furthermore, the first pixel electrode 101 and the common electrode 103 are arranged in parallel to form a first liquid crystal capacitance Clc1, the first pixel electrode 101 and the common electrode line Com are arranged in parallel to form a first storage capacitance Cst1, the second pixel electrode 102 and the common electrode 103 are arranged in parallel to form a second liquid crystal capacitance Clc2, and the second pixel electrode 102 and the common electrode line Com are arranged in parallel to form a second storage capacitance Cst2. A voltage of the common electrode 103 is the same as a voltage of the common electrode line Com. The first liquid crystal capacitance Clc1 provides deflection voltage for the liquid crystal molecules corresponding to the first pixel electrode 101. The first storage capacitance Cst1 provides maintained voltage for the first liquid crystal capacitance Clc1, the second storage capacitance Cst2 provides deflection voltage for the liquid crystal molecules corresponding to the second pixel electrode 102, and the second storage capacitance Cst2 provides maintained voltage for the second liquid crystal capacitance Clc2. Furthermore, the first pixel electrode 101 and the second pixel electrode 102 both correspond to four domains of the liquid crystal molecules. Display of eight domains is achieved by applying different voltage on the first pixel electrode 101 and the second pixel electrode 102.

Furthermore, the first switch T1 is a thin film transistor (TFT), the control terminal a, the first terminal b, and the second terminal c of the first switch T1 are a gate electrode, a source electrode, and a drain electrode of the TFT, respectively. The second switch T2 is a double-source electrode TFT, the control terminal d, the first terminal e, the second terminal f, and the third terminal g of the second switch T2 are a gate electrode, a first source electrode, a second source electrode, and a drain electrode of the double-source electrode TFT, respectively.

Figure 2:
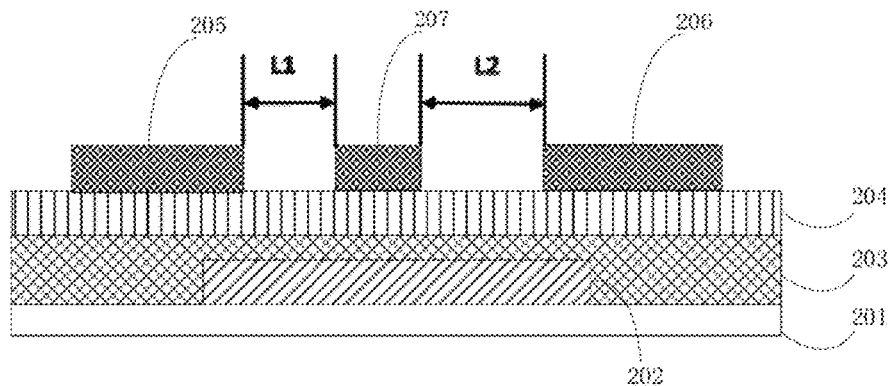
FIG. 2 is a structural diagram of a second switch of the pixel driving circuit of a preferred embodiment of the present disclosure.

FIG. 2 is a structural diagram of the second switch of the pixel driving circuit of a preferred embodiment of the present disclosure. The second switch T2 successively from top to down comprises a substrate 201, a gate electrode 202, an insulating layer 203, a conductive channel layer 204, a first source electrode 205, a second source electrode 206, and a drain electrode 207. The first source electrode 205, the second source electrode 206, and the drain electrode 207 are arranged on the conductive channel layer 204. To be specific, the first source electrode 205, the second source electrode 206, and the drain electrode 207 of the double-source electrode TFT are on a same layer. The drain electrode 207 of the double-source electrode TFT is arranged between the first source electrode 205 and the second source electrode 206 of the double-source electrode TFT. L1 is a distance between the first source electrode 205 and the drain electrode 207 of the double-source electrode TFT. L2 is a distance between the second source electrode 206 and the drain electrode 207 of the double-source electrode TFT. A person skilled in the an can set L1 and L2 according to requirements.

To be specific, the first source electrode 205 of the double-source electrode TFT is connected with the data line, the second source electrode 206 of the double-source electrode TFT is connected with a common electrode line, and the gate electrode 202 of the double-source electrode TFT is connected with the scanning line, a relationship between a voltage of the second pixel electrode and the data voltage provided by the data line is V2=(V1*L2−Vcom*L1)(L1+L2), where V2 is the voltage of the second pixel electrode 202, V1 is the data voltage provided by the data line, Vcom is a common voltage provided by the common electrode line, L1 is a distance between the first source electrode 205 and the drain electrode 207 of the double-source electrode TFT. L2 is a distance between the second source electrode 206 and the drain electrode 207 of the double-source electrode TFT.

The source electrode of the TFT is connected with the data line Data, the drain electrode of the TFT is connected with the first pixel electrode 101, and the gate electrode of the TFT is connected with the scanning line Gate. A relationship between the voltage of the first pixel electrode 101 and the data voltage provided by the data line is V3=V1, where the V3 is the voltage of the first pixel electrode 101, and V1 is the data voltage provided by the data line.

Figure 3:
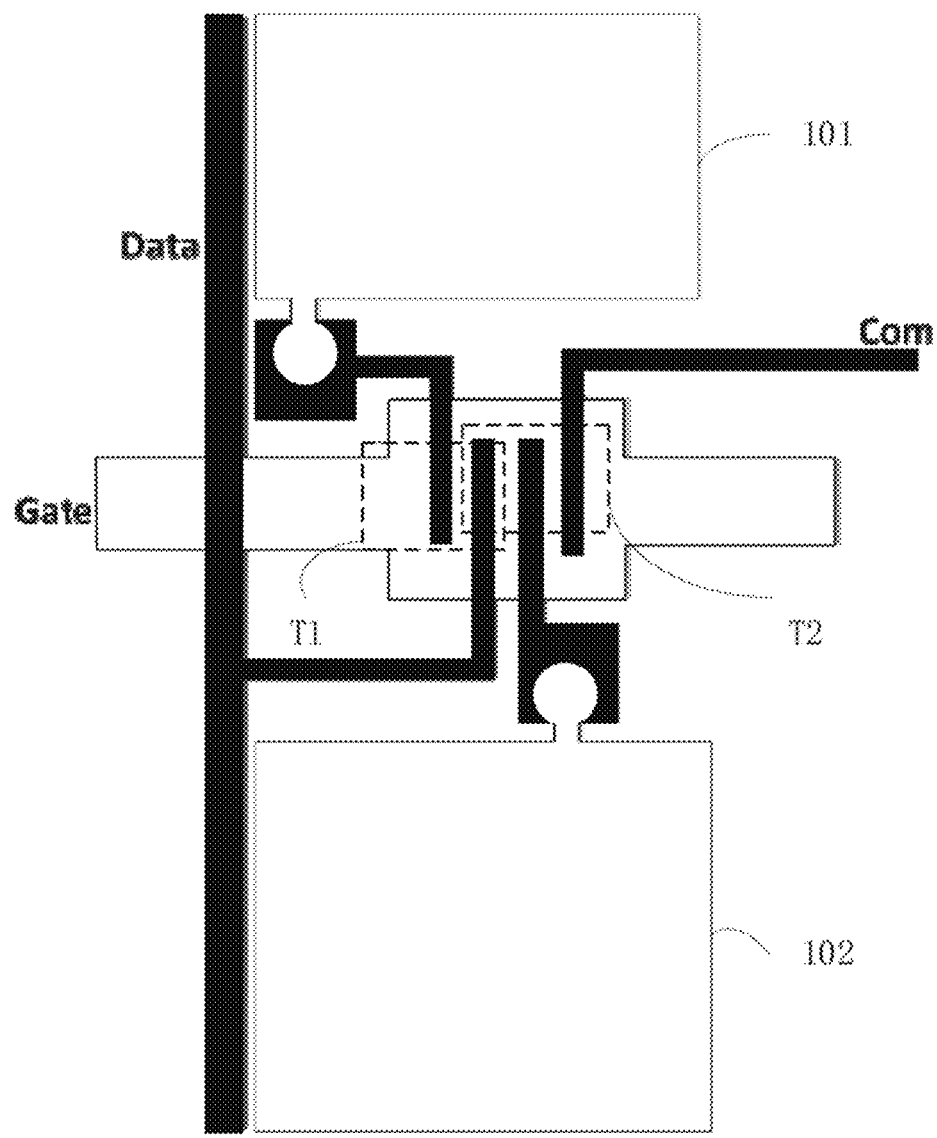
FIG. 3 is a first structural diagram of a first switch and the second switch of the pixel driving circuit of a preferred embodiment of the present disclosure.
Figure 4:
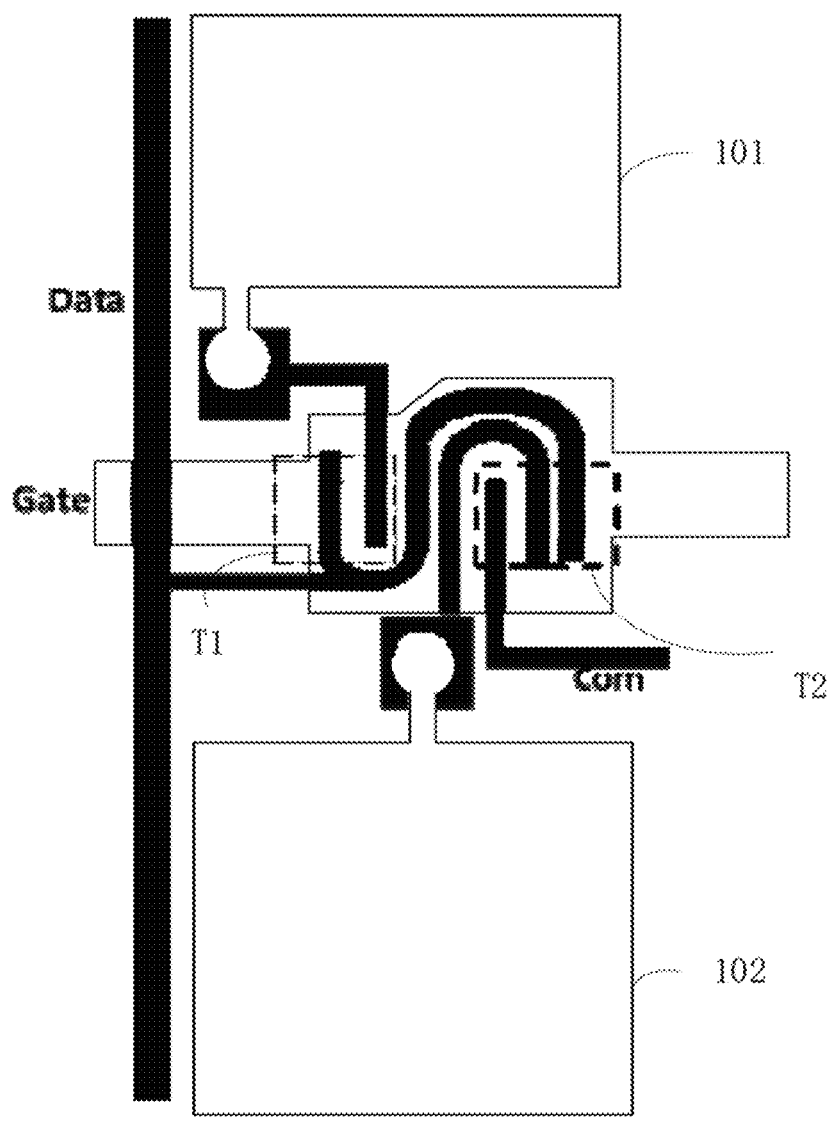
FIG. 4 is a second structural diagram of the first switch and the second switch of the pixel driving circuit of a preferred embodiment of the present disclosure.

FIG. 3 is a first structural diagram of a first switch and the second switch of the pixel driving circuit of a preferred embodiment of the present disclosure, and FIG. 4 is a second structural diagram of the first switch and the second switch of the pixel driving circuit of a preferred embodiment of the present disclosure.

As shown in FIG. 1, FIG. 2, and FIG. 3, the first switch T1 is a thin film transistor (TFT), the second switch T2 is a double-source electrode TFT. The gate electrode of the TFT and the double-source electrode TFT both are connected with the scanning line Gate. The scanning line Gate, the gate electrode of the TFT, and the gate electrode of the double-source electrode TFT are formed from a same metal layer. The gate electrode of the TFT and the gate electrode of the double-source electrode TFT share a same electrode.

The source electrode of the TFT and the first source electrode of the double-source electrode TFT both are connected with the data line Data, the second source electrode of the double-source electrode TFT is connected with the common electrode line Com. The data line Data, the source electrode of the TFT, the first source electrode, the second source electrode, and the drain electrode of the double-source electrode TFT are formed from a same metal layer. The source electrode of the TFT and the first source electrode of the double-source electrode TFT share a same electrode.

In addition, the drain electrode of the TFT is connected with the first pixel electrode 101, and the drain electrode of the double-source electrode TFT is connected with the second pixel electrode 102.

It should be understood that FIG. 3 and FIG. 4 show different structures which achieve the same function. The difference between FIG. 3 and FIG. 4 is that: the electrode forming the source electrode of the TFT and forming the first source electrode and the second source electrode of the double-source electrode TFT is strip-shaped in FIG. 3; the electrode forming the source electrode of the TFT and forming the first source electrode and the second source electrode of the double-source electrode TFT is curved-shaped in FIG. 4.

As shown in FIG. 1, FIG. 2, and FIG. 4, the first switch T1 is a thin film transistor (TFT), the second switch T2 is a double-source electrode TFT. The gate electrode of the TFT and the double-source electrode TFT both are connected with the scanning line Gate. The scanning line Gate, the gate electrode of the TFT, and the gate electrode of the double-source electrode TFT are formed from a same metal layer. The gate electrode of the TFT and the gate electrode of the double-source electrode TFT share a same electrode.

The source electrode of the TFT and the first source electrode of the double-source electrode TFT both are connected with the data line Data, the second source electrode of the double-source electrode TFT is connected with the common electrode line Com. The data line Data, the source electrode of the TFT, the first source electrode, the second source electrode, and the drain electrode of the double-source electrode TFT are formed from a same metal layer. The source electrode of the TFT and the first source electrode of the double-source electrode TFT share a same electrode.

In addition, the drain electrode of the TFT is connected with the first pixel electrode 101, and the drain electrode of the double-source electrode TFT is connected with the second pixel electrode 102.

The present disclosure provides a pixel driving circuit to connect the first terminal, a second terminal, and a third terminal of the second switch with the data line, the common electrode line, and the second pixel electrode, respectively, such that voltage of the second pixel electrode is between the data voltage provided by the data line and the common voltage provided by the common electrode line. Furthermore, a predetermined voltage difference is formed between the first pixel electrode and the second pixel electrode. Thus, the color shift problem is solved, aperture ratio increases, and parasitic capacitance is not increased, further improving display.

The present disclosure further provides a liquid crystal panel comprising the above pixel driving circuit, it refers to the above description of the pixel driving circuit, there will not be described thereto.

The present disclosure provides the pixel driving circuit and the LCD panel to connect the first terminal, a second terminal, and a third terminal of the second switch with the data line, the common electrode line, and the second pixel electrode, respectively, such that voltage of the second pixel electrode is between the data voltage provided by the data line and the common voltage provided by the common electrode line. Furthermore, a predetermined voltage difference is formed between the first pixel electrode and the second pixel electrode. Thus, the color shift problem is solved, aperture ratio increases, and parasitic capacitance is not increased, further improving the display.

Components of the LCD of the present disclosure are described in detail in the above. Specific embodiments are used herein to describe the principle and enforcement of the present disclosure. The description of the foregoing embodiments is merely used to help understand the present disclosure. It should be understood that the present disclosure has been described with reference to certain preferred and alternative embodiments which are intended to be exemplary only and do not limit the full scope of the present disclosure as set forth in the appended claims.

What is claimed is:
1. A pixel driving circuit, comprising:
   a plurality of sub-pixel units defined by a plurality of scanning lines intersecting with a plurality of data lines;
   each of the sub-pixel units is connected with one scanning line and one data line; each of the sub-pixel units comprises a first switch, a second switch, a first pixel electrode, and a second pixel electrode;

wherein the first switch has a control terminal, a first terminal, and a second terminal; wherein the control terminal of the first switch is connected with one of the scanning lines, the first terminal of the first switch is connected with one of the data lines, and the second terminal of the first switch is connected with the first pixel electrode; the first terminal and the second terminal of the first switch are turned on under control of a scanning signal provided by the scanning line;

wherein the second switch has a control terminal, a first terminal, a second terminal, and a third terminal; wherein the control terminal of the second switch is connected with one of the scanning lines, the first terminal of the second switch is connected with one of the data lines, the second terminal of the second switch is connected with a common electrode line, and the third terminal of the second switch is connected with the second pixel electrode; the first terminal, the second terminal, and the third terminal of the second switch are turned on under control of the scanning signal provided by the scanning line such that a predetermined voltage difference is formed between the first pixel electrode and the second pixel electrode;

wherein the first switch is a thin film transistor (TFT), the control terminal, the first terminal, and the second terminal of the first switch are a gate electrode, a source electrode, and a drain electrode of the TFT, respectively;

wherein the second switch is a double-source electrode TFT, the control terminal, the first terminal, the second terminal, and the third terminal of the second switch are a gate electrode, a first source electrode, a second source electrode, and a drain electrode of the double-source electrode TFT, respectively;

wherein the first pixel electrode and the second pixel electrode both correspond to four domains of liquid crystal molecules.

2. The pixel driving circuit as claimed in claim 1, wherein the first source electrode, the second source electrode, and the drain electrode of the double-source electrode TFT are on a same layer, and the drain electrode of the double-source electrode TFT is arranged between the first source electrode and the second source electrode of the double-source electrode TFT.

3. The pixel driving circuit as claimed in claim 2, wherein a voltage of the first pixel electrode is a data voltage provided by one of the data lines; a relationship between a voltage of the second pixel electrode and the voltage of the first pixel electrode is $V2(V1*L2-Vcom*L1)/(L1+L2)$, wherein V2 is the voltage of the second pixel electrode, V1 is the voltage of the first pixel electrode, Vcom is a common voltage provided by the common electrode line, L1 is a distance between the first source electrode and the drain electrode of the double-source electrode TFT; L2 is a distance between the second source electrode and the drain electrode of the double-source electrode TFT.

4. The pixel driving circuit as claimed in claim 1, wherein the scanning line, the gate electrode of the TFT, and the gate electrode of the double-source electrode TFT are formed from a same metal layer.

5. The pixel driving circuit as claimed in claim 4, wherein the gate electrode of the TFT and the gate electrode of the double-source electrode TFT share a same electrode.

6. The pixel driving circuit as claimed in claim 1, wherein the data line, the source electrode and the drain electrode of the TFT, the first source electrode, the second source electrode and the drain electrode of the double-source electrode TFT are formed from a same metal layer.

7. The pixel driving circuit as claimed in claim 6, wherein the source electrode of the TFT and the first source electrode of the double-source electrode TFT share a same electrode.

8. A pixel driving circuit, comprising:

a plurality of sub-pixel units defined by a plurality of scanning lines intersecting with a plurality of data lines; each of the sub-pixel units is connected with one scanning line and one data line; each of the sub-pixel units comprises a first switch, a second switch, a first pixel electrode, and a second pixel electrode;

wherein the first switch has a control terminal, a first terminal, and a second terminal; wherein the control terminal of the first switch is connected with one of the scanning lines, the first end of the first switch is connected with one of the data lines, and the second terminal of the first switch is connected with the first pixel electrode; the first terminal and the second terminal of the first switch are turned on under control of a scanning signal provided by the scanning line;

wherein the second switch has a control terminal, a first terminal, a second terminal, and a third terminal; wherein the control terminal of the second switch is connected with one of the scanning lines, the first terminal of the second switch is connected with one of the data lines, the second terminal of the second switch is connected with a common electrode line, and the third terminal of the second switch is connected with the second pixel electrode; the first terminal, the second terminal, and the third terminal of the second switch are turned on under control of the scanning signal provided by the scanning line such that a predetermined voltage difference is formed between the first pixel electrode and the second pixel electrode.

9. The pixel driving circuit as claimed in claim 8, wherein the first switch is a thin film transistor (TFT), the control terminal, the first terminal, and the second terminal of the first switch are a gate electrode, a source electrode, and a drain electrode of the TFT, respectively;

wherein the second switch is a double-source electrode TFT, the control terminal, the first terminal, the second terminal, and the third terminal of the second switch are a gate electrode, a first source electrode, a second source electrode, and a drain electrode of the double-source electrode TFT, respectively.

10. The pixel driving circuit as claimed in claim 9, wherein the first source electrode, the second source electrode, and the drain electrode of the double-source electrode TFT are on a same layer, and the drain electrode of the double-source electrode TFT is arranged between the first source electrode and the second source electrode of the double-source electrode TFT.

11. The pixel driving circuit as claimed in claim 10, wherein a voltage of the first pixel electrode is a data voltage provided by one of the data lines; a relationship between a voltage of the second pixel electrode and the voltage of the first pixel electrode is $V2=(V1*L2-Vcom*L1)/(L1+L2)$, wherein V2 is the voltage of the second pixel electrode, V1 is the voltage of the first pixel electrode, Vcom is a common voltage provided by the common electrode line, L1 is a distance between the first source electrode and the drain electrode of the double-source electrode TFT; L2 is a distance between the second source electrode and the drain electrode of the double-source electrode TFT.

12. The pixel driving circuit as claimed in claim 9, wherein the scanning line, the gate electrode of the TFT, and the gate electrode of the double-source electrode TFT are formed from a same metal layer.

13. The pixel driving circuit as claimed in claim 12, wherein the gate electrode of the TFT and the gate electrode of the double-source electrode TFT share a same electrode.

14. The pixel driving circuit as claimed in claim 9, wherein the data line, the source electrode and the drain electrode of the TFT, the first source electrode, the second source electrode and the drain electrode of the double-source electrode TFT are formed from a same metal layer.

15. The pixel driving circuit as claimed in claim 14, wherein the source electrode of the TFT and the first source electrode of the double-source electrode TFT share a same electrode.

16. The pixel driving circuit as claimed in claim 8, wherein the first pixel electrode and the second pixel electrode both correspond to four domains of liquid crystal molecule.

17. A liquid crystal display (LCD) panel, comprising: a pixel driving circuit; wherein the pixel driving circuit comprises a plurality of sub-pixel units defined by a plurality of scanning lines intersecting with a plurality of data lines; each of the sub-pixel units is connected with one scanning line and one data line; each of the sub-pixel units comprises a first switch, a second switch, a first pixel electrode, and a second pixel electrode;

wherein the first switch has a control terminal, a first terminal, and a second terminal; wherein the control terminal of the first switch is connected with one of the scanning lines, the first end of the first switch is connected with one of the data lines, and the second terminal of the first switch is connected with the first pixel electrode; the first terminal and the second terminal of the first switch are turned on under control of a scanning signal provided by the scanning line;

wherein the second switch has a control terminal, a first terminal, a second terminal, and a third terminal; wherein the control terminal of the second switch is connected with one of the scanning lines, the first terminal of the second switch is connected with one of the data lines, the second terminal of the second switch is connected with a common electrode line, and the third terminal of the second switch is connected with the second pixel electrode; the first terminal, the second terminal, and the third terminal of the second switch are turned on under control of the scanning signal provided by the scanning line such that a predetermined voltage difference is formed between the first pixel electrode and the second pixel electrode.

18. The LCD panel as claimed in claim 17, wherein the first switch is a thin film transistor (TFT), the control terminal, the first terminal, and the second terminal of the first switch are a gate electrode, a source electrode, and a drain electrode of the TFT, respectively;

wherein the second switch is a double-source electrode TFT, the control terminal, the first terminal, the second terminal, and the third terminal of the second switch are a gate electrode, a first source electrode, a second source electrode, and a drain electrode of the double-source electrode TFT, respectively.

19. The LCD panel as claimed in claim 18, wherein the first source electrode, the second source electrode, and the drain electrode of the double-source electrode TFT are on a same layer, and the drain electrode of the double-source electrode ITT is arranged between the first source electrode and the second source electrode of the double-source electrode TFT.

20. The LCD panel as claimed in claim 19, wherein a voltage of the first pixel electrode is a data voltage provided by one of the data lines; a relationship between a voltage of the second pixel electrode and the voltage of the first pixel electrode is V2=(V1*L2−Vcom*L1)/(L1+L2), wherein V2 is the voltage of the second pixel electrode, Vcom is a common voltage provided by the common electrode line, L1 is a distance between the first source electrode and the drain electrode of the double-source electrode TFT, L2 is a distance between the second source electrode and the drain electrode of the double-source electrode TFT.

* * * * *